United States Patent
Mulder et al.

(10) Patent No.: US 7,312,850 B2
(45) Date of Patent: Dec. 25, 2007

(54) LITHOGRAPHIC APPARATUS, ILLUMINATION SYSTEM, AND OPTICAL ELEMENT FOR ROTATING AN INTENSITY DISTRIBUTION

(75) Inventors: Heine Melle Mulder, Eindhoven (NL); Hako Botma, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 267 days.

(21) Appl. No.: 10/816,170

(22) Filed: Apr. 2, 2004

(65) Prior Publication Data

US 2005/0219494 A1   Oct. 6, 2005

(51) Int. Cl.
  G03B 27/54   (2006.01)
  G03B 27/42   (2006.01)
  G03B 27/32   (2006.01)
  G02B 5/08    (2006.01)

(52) U.S. Cl. ............................. 355/67; 355/53; 355/77; 359/850

(58) Field of Classification Search .................. 355/67, 355/53, 69, 71, 77; 356/326; 359/627, 197, 359/206, 236, 850
See application file for complete search history.

(56) References Cited

U.S. PATENT DOCUMENTS

| | | | |
|---|---|---|---|
| 5,121,160 A * | 6/1992 | Sano et al. .................... 355/53 |
| 5,859,707 A * | 1/1999 | Nakagawa et al. .......... 356/401 |
| 5,991,009 A * | 11/1999 | Nishi et al. .................... 355/70 |
| 6,102,554 A * | 8/2000 | Wynne Willson et al. .. 362/281 |
| 6,122,107 A | 9/2000 | Koch et al. |
| 6,231,198 B1 * | 5/2001 | Foo .............................. 359/855 |
| 6,337,734 B1 * | 1/2002 | Mori ............................ 355/69 |
| 2001/0015797 A1 * | 8/2001 | Suzuki et al. .................. 355/53 |
| 2002/0001134 A1 * | 1/2002 | Shinoda ....................... 359/627 |
| 2002/0075468 A1 * | 6/2002 | Antoni ......................... 355/67 |
| 2003/0025890 A1 * | 2/2003 | Nishinaga .................... 355/53 |
| 2003/0030780 A1 * | 2/2003 | Dieckmann et al. .......... 355/67 |
| 2003/0038225 A1 * | 2/2003 | Mulder et al. ................ 250/205 |
| 2003/0038931 A1 * | 2/2003 | Toyoda et lal. ............... 355/67 |
| 2003/0043356 A1 * | 3/2003 | Shiraishi ....................... 355/53 |
| 2003/0151730 A1 * | 8/2003 | Shinoda ....................... 355/69 |
| 2003/0198050 A1 * | 10/2003 | Yamazaki et al. .......... 362/268 |
| 2004/0021845 A1 * | 2/2004 | Kawahara .................... 355/67 |
| 2004/0051858 A1 * | 3/2004 | Mulkens et al. .............. 355/67 |
| 2005/0046837 A1 * | 3/2005 | Izumi et al. ................. 356/326 |
| 2005/0099635 A1 * | 5/2005 | Kakuchi et al. ............ 356/515 |
| 2005/0134820 A1 * | 6/2005 | Mulder et al. ................ 355/67 |

* cited by examiner

Primary Examiner—Alan Mathews
(74) Attorney, Agent, or Firm—Pillsbury Winthrop Shaw Pittman LLP

(57) ABSTRACT

A lithographic projection apparatus includes an illumination system having a reflective integrator with a rectangular cross-section. An optical element is provided to redistribute an intensity distribution exiting the reflective integrator.

18 Claims, 4 Drawing Sheets

LITHOGRAPHIC APPARATUS, ILLUMINATION SYSTEM, AND OPTICAL ELEMENT FOR ROTATING AN INTENSITY DISTRIBUTION

BACKGROUND OF THE INVENTION

1. Field of the Invention

The present invention relates generally to lithographic apparatus, an illumination system for use in lithographic apparatus contained therein, and to optical elements for manipulating a beam of radiation.

2. Description of the Prior Art

A lithographic apparatus is a machine that applies a desired pattern comprising features, structures, or line patterns onto a target portion of a substrate. Lithographic apparatus can be used, for example, in the manufacture of micro structure devices such as integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate contains a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Current structures on micro structure devices are often called 'Manhattan structures' since they are characterized by an orientation of the structures, line patterns, or features in mainly two perpendicular directions similar to a pattern of city streets. In current structure layout designs, these two directions are kept parallel to the respective boundary segments of a rectangular target exposure area on the substrate (die). By one convention, horizontal structures extend in an X-direction while vertical structures extend in a Y-direction. The width of the target portion is defined as the size of the rectangular area in the X-direction, and the height of the target portion is defined as the size of the rectangular area in the Y-direction. In lithographic scanners, the non-scanning direction is normally referred to as the X-direction while the scanning direction is referred to as the Y-direction.

A recent development in the layout design of micro structures is the use of features with an orientation other than strictly in the X- or Y-direction, i.e., line patterns extending in a direction that can make any angle between 0 and 90 degrees with respect to the X-direction. For example, the imaging of DRAM isolating structures may be optimized by using an angle between 20 and 30 degrees with respect to either the X- or Y-axis. Optimized imaging comprises for example an enhanced process latitude or increased depth of focus.

It is known that the imaging of structures with a certain orientation can be optimized by illuminating the mask with a projection beam containing rays of radiation with directions substantially perpendicular to the direction of the structures. The angular intensity distribution of the projection beam in a field plane such as the mask plane corresponds to a spatial intensity distribution in a pupil plane (the latter usually called "pupil shape" or just "pupil"). For example, the imaging of horizontal structures may be optimized by employing a projection beam with an associated pupil shape that has two high intensity regions separated from the optical axis in the Y-direction. The latter kind of pupil shape is referred to hereinafter as dipole. The corresponding illumination mode is referred to as dipole illumination, in this particular case as dipole Y illumination. Similarly, the imaging of structures that make an angle a with the X-axis can be optimized by dipole Y illumination in which the pupil is rotated over the same angle α. In general, when the imaging of certain structures is optimized by using a particular pupil shape, then if the structures are rotated around an axis also the pupil shape should be rotated around the same axis by an equal amount in order to maintain the same imaging performance. The pupil plane of the illumination system downstream of the integrator is also known in the art as the Fourier transform plane.

Current lithographic apparatus include an illumination system for providing a conditioned projection beam of radiation having desired dimensions, a desired spatial intensity distribution, and a desired angular intensity distribution at mask level. The illumination system includes an integrator to improve the uniformity of the projection beam with regard to spatial and angular intensity variations over the beam cross-section. The principle of an integrator is based on the creation of a plurality of secondary radiation sources or virtual secondary sources from a primary source, such that the beams originating from these secondary sources overlap at an intermediate field plane and average out. This averaging effect is called light integrating or light mixing.

One type of integrator is based on multiple reflections, referred to hereinafter as reflective integrator, and is embodied for example as a crystal rod made of quartz or calcium-fluoride ($CaF_2$) or as a hollow waveguide, the faces of which are made of reflective material. This type of integrator generally has a rectangular (or square) cross-section and parallel side faces. Multiple secondary light sources are formed via multiple internal reflections (in the case of a rod type integrator) or via multiple specular reflections (in the case of a hollow waveguide type integrator) of the incoming radiation beam. Each reflective surface of the integrator ideally provides 100% reflection, but in practice the intensity of the reflected beam is decreased after each reflection due to residual surface defects or absorption.

An inherent property of a reflective integrator having a rectangular cross-section is that the angular intensity distribution of a beam exiting the integrator is forced to be symmetric with respect to the side faces of the integrator. i.e., the pupil shape of the beam that enters the integrator can be any shape, but due to the mixing of rays of radiation that has either made an even or an uneven number of reflections in the reflective integrator, the pupil shape of the beam that exits the integrator is mirror-symmetric with respect to two perpendicular axes parallel to the respective boundary segments of the rectangular cross-section of the reflective integrator, these axes normally oriented in the X- and Y-direction.

A problem with current lithographic apparatus including a reflective type of integrator (rod or hollow waveguide) arises when the imaging needs to be optimized for structures that extend in directions other than in the X- and/or Y-direction. For these other directions, a pupil shape of the projection beam which is non-mirror-symmetric with respect to the X- and Y-axes would be optimal. Such a pupil shape may also be referred to as a rotated mirror-symmetric pupil shape, or simply as a rotated pupil shape. Current illumination systems with reflective integrators are constructed and arranged such that they can provide mirror-symmetric pupil shapes such as for example annular, dipole-X, dipole-Y, quadrupole, hexapole, octopole. However, these systems cannot provide non-mirror-symmetric pupil shapes such as monopole, rotated dipole, tripole, rotated quadrupole.

SUMMARY OF THE INVENTION

Embodiments of the current invention enable a lithographic apparatus with a reflective type of integrator to optimize the imaging of structures that extend in directions other than the X- and/or Y-direction with a minor loss of intensity of the projection beam of radiation.

This and other aspects are achieved according to embodiments of the present invention by a lithographic apparatus including an illumination system for providing a conditioned beam of radiation, the illumination system including a reflective type of integrator (rod or waveguide) and an optical element constructed and arranged to redistribute an intensity distribution of a beam of radiation. In a preferred embodiment this redistribution approximates a rotation of the intensity distribution around the optical axis of the lithographic apparatus over an angle between 5 and 85 degrees. Rotation in this context is defined as a redistribution of the intensity such that each small part of the intensity distribution is reallocated over a distance that linearly increases with distance from the optical axis, and such that the distance between the optical axis and each part of the intensity distribution is constant. Alternatively, rotation may be defined as a reallocation of substantial parts of the intensity distribution as a whole over a distance that linearly increases with distance from the optical axis, and such that the distance between the optical axis and each substantial part of the intensity distribution is constant.

The reflective integrator has a rectangular cross-section, its exit dimensions determining the size of the rectangular illumination field in the X and Y directions. Due to multiple reflections in the integrator, the pupil shape (or angular intensity distribution) of the beam of radiation downstream of the integrator is mirror-symmetric with respect to these X and Y axes. In one embodiment of the lithographic apparatus according to the present invention, the optical element redistributes, preferably rotates, the spatial intensity distribution at a pupil plane downstream of the integrator thereby uncoupling the fixed relation between the orientation of the field (X- and Y-axes) and the axes of mirror-symmetry of the pupil. This has the immediate advantage that it is now possible to provide at mask level a conditioned projection beam of radiation with a non-mirror-symmetric pupil shape or angular intensity distribution, optimized for imaging structures in directions other than the X- and Y-direction.

In another embodiment of the present invention, the optical element includes at least one pair of reflective surfaces constructed and arranged to reallocate part of an intensity distribution of the beam of radiation. The first reflective surface of a pair directs incoming rays of radiation of a part of the beam towards the second reflective surface of that pair which subsequently directs these rays of radiation in an outgoing direction. The one pair of reflective surfaces can provide a rotation of the part of the intensity distribution if the distance between the optical axis and the part of the intensity distribution before and after the optical element is equal.

The reflective surfaces can be embodied as mirrors coated with a reflective multilayer depending on the specific wavelength used. Alternatively, the reflective surfaces can be embodied as the surfaces of a transmissive element such as for example quartz or calcium-fluoride, where the reflection is total internal reflection or where the reflection is created by a metallic layer or multilayer deposited on the surface of the transmissive element. An important advantage of the current invention is that by redistributing or rotating the intensity distribution by means of reflection, the radiation intensity is only minorly decreased, as compared to blocking part of the intensity distribution to create a non-mirror-symmetric intensity distribution which substantially reduces the intensity of the beam. A high beam intensity favors the throughput (the number of processed wafers per hour) which is an important indicator for the overall performance of the lithographic apparatus.

In an embodiment of the optical element according to the present invention, the reflective surfaces of each pair are planar and parallel to each other so that corresponding incoming and outgoing rays of radiation have the same direction. The advantage of this is that although the spatial intensity distribution is redistributed (e.g., rotated around the optical axis), the angular intensity distribution is not changed by the optical element.

In another embodiment, the optical element includes two pairs of reflective surfaces for rotating an intensity distribution in a pupil plane of the illumination system, the intensity distribution including two off-axis high intensity regions (poles), such as in a dipole X or dipole Y illumination mode. Each pair of reflective surfaces rotates each pole of the intensity distribution, and may be embodied as a pair of coated mirrors. This embodiment enables the lithographic apparatus and the illumination system to provide a conditioned projection beam of radiation having a dipole pupil shape rotated with respect to the X and Y axes over any angle between 5 and 85 degrees, thereby optimizing the imaging of structures that extend in directions other than the X- and/or Y-direction with a minor loss of intensity of the projection beam of radiation.

A last embodiment of the current invention is a lithographic apparatus with an optical element that includes a plurality of pairs of reflective surfaces covering substantially the whole pupil plane, such that substantially a whole arbitrary intensity distribution can be redistributed, preferably rotated. The plurality of pairs of reflective surfaces may be embodied as a plurality of radially extending and tilted mirror blades, the blades including a reflective coating at both sides. To make the pairs of reflective surfaces parallel to each other, the thickness of the mirror blades may vary as a function of distance from the optical axis and as a function of angle around the optical axis. This embodiment enables for example the rotation of a quadrupole or hexapole pupil shape.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam corresponds to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e., bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

DESCRIPTION OF THE DRAWINGS

Embodiments of the invention will now be described, by way of example only, with reference to the accompanying schematic drawings in which corresponding reference symbols indicate corresponding parts, and in which:

FIGS. 2a-g demonstrate the formation of a mirror-symmetric pupil shape in a pupil plane of the illumination system by a reflective integrator.

DETAILED DESCRIPTION OF THE PRESENT INVENTION

Figure 1:
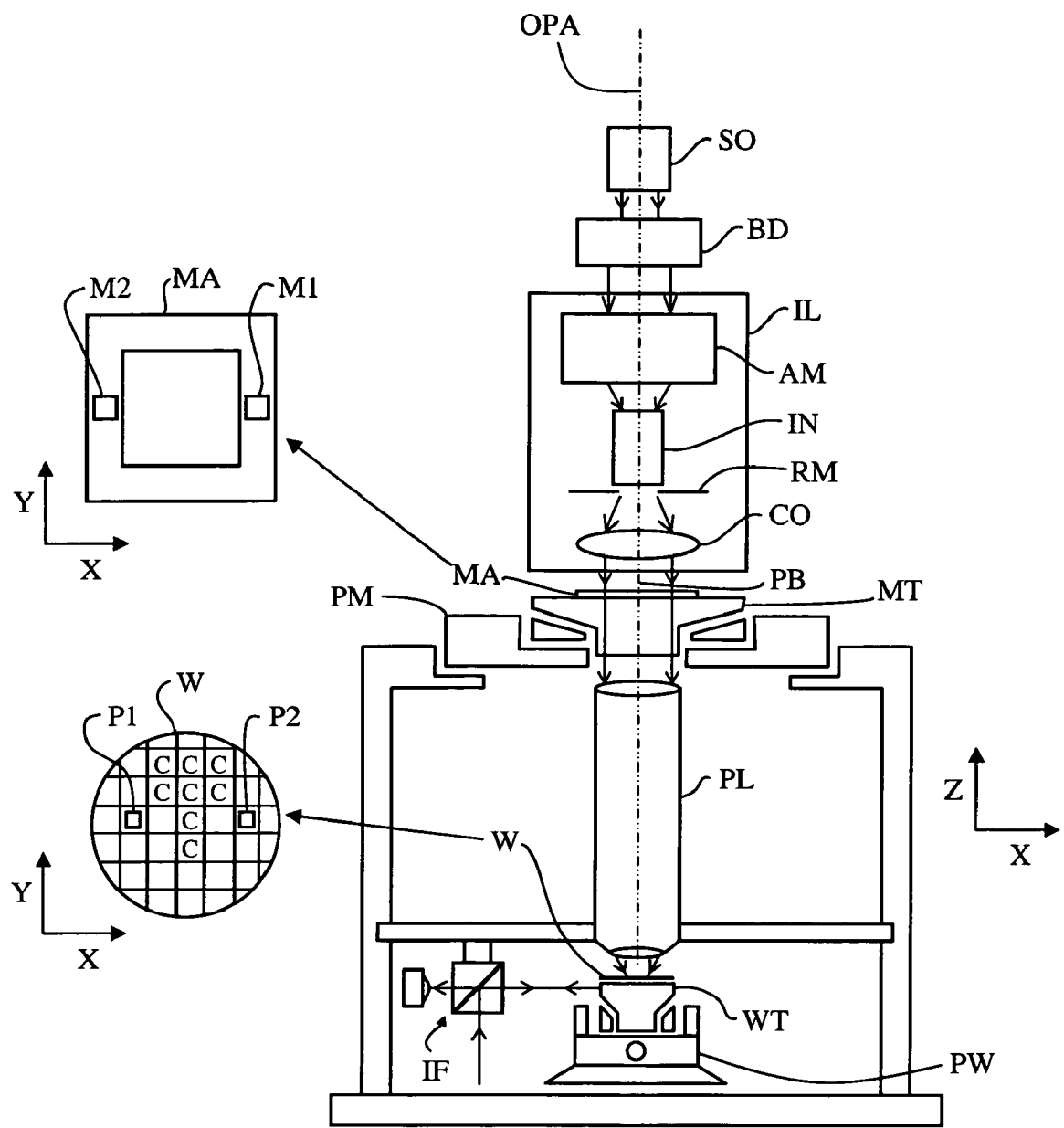
FIG. 1 depicts a lithographic apparatus according to an embodiment of the invention.

FIG. 1 schematically shows a lithographic apparatus according to a particular embodiment of the invention. The apparatus includes:

- an illumination system (illuminator) IL for providing a conditioned projection beam of radiation PB (e.g., UV radiation or DUV radiation, i.e., electromagnetic radiation with a wavelength between 100 and 400 nm, for example 365, 248, 193, or 157 nm);
- a support structure (e.g., a mask table) MT for supporting a patterning device (e.g., a mask or a reticle) MA and connected to first positioning means PM for accurately positioning the patterning device with respect to item PL;
- a substrate table (e.g., a wafer table) WT for holding a substrate (e.g., a resist-coated wafer) W and connected to second positioning means PW for accurately positioning the substrate with respect to item PL; and
- a projection system (e.g., a refractive projection lens) PL for imaging a pattern imparted to the projection beam PB by patterning device MA onto a target portion C (e.g., comprising one or more dies) of the substrate W.

As here depicted, the apparatus is of a transmissive type (e.g., employing a transmissive mask). Alternatively, the apparatus may be of a reflective type (e.g., employing a programmable mirror array of a type as referred to above).

As here depicted the subsequent optical elements or modules of the lithographic apparatus are disposed along a straight optical axis OPA. This means that the optical axis runs symmetrically through the center of the subsequent optical elements such as the integrator IN, condensor CO, and projection system PL. However, the optical axis may also comprise several contiguous straight segments oriented in different directions by using for example beam bending mirrors in order to change the layout and reduce the size of the whole apparatus.

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjustable components AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN (for example a reflective integrator such as a quartz rod) and a condenser CO. The illuminator provides a conditioned beam of radiation, referred to as the projection beam PB, having a desired uniformity and intensity distribution in its cross-section. The illuminator IL further comprises a reticle masking unit RM in order to mask of part of the rectangular area on the patterning device (or reticle) that is being illuminated by the projection beam. Usually, two of the blades define the size of the slit in the non-scanning direction, while the other two blades are used for limiting the die size in the scanning direction. A conventional reticle masking unit therefore contains four independently movable blades, the blades overlapping each other or positioned adjacent to each other, and the blades positioned in a field plane after the integrator, for example immediately after the integrator, or adjacent to the patterning device.

The projection beam PB is incident on the mask MA, which is held on the mask table MT. Having traversed the mask MA, the projection beam PB passes through the lens PL, which focuses the beam onto a target portion C of the substrate W. With the aid of the second positioning means PW and position sensor IF (e.g., an interferometric device), the substrate table WT can be moved accurately, e.g., so as to position different target portions C in the path of the beam PB. Similarly, the first positioning means PM and another position sensor (not shown) can be used to accurately position the mask MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioning means PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e., a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 2a-g illustrates the integrating or mixing effect of a reflective integrator IN, for example, a rod made of quartz or $CaF_2$ having a rectangular cross-section, and the formation of a pupil that is mirror-symmetric with respect to two perpendicular central axes, the axes being parallel to respective boundary segments of the cross-section of the reflective integrator when viewed in a common plane perpendicular to the optical axis.

An incoming beam of radiation has an angular intensity distribution corresponding to a spatial intensity distribution in pupil plane 20 upstream of the integrator IN. A beam of radiation first traverses pupil plane 20 and next traverses integrator IN. Two rays of radiation 22 and 23 of the incoming radiation beam are traced through the optical system comprising an incoupling lens 27a, an integrator IN, and an outcoupling lens 27b. The two parallel rays 22 and 23 are focused by incoupling lens 27a and form a primary radiation source 24. In this figure, the position of primary source 24 coincides with the entrance face of the integrator, but primary source 24 may also be located before or after the entrance face of the integrator, for example to reduce the local intensity at the entrance face. In the integrator, ray 22 is reflected 5 times at the horizontal faces of the integrator, and on exiting the integrator, ray 22 ends up having a mirrored direction. Note that also the position of ray 22 at the exit face differs from the position at the entrance face. Ray 22 can be regarded as originating from secondary source 26. Ray 23 is reflected 4 times at the horizontal faces of the integrator, and on exiting the integrator, ray 23 shows no change of direction. Ray 23 can be regarded as originating from secondary source 25. Effectively, the integrator creates a plurality of virtual secondary sources, the secondary sources illuminating the exit face of the integrator, thereby providing a mixing of the radiation beam and increasing the uniformity of the beam. In addition, rays of radiation that experience an uneven number of reflections at the horizontal faces of the integrator obtain a mirrored direction upon exiting the integrator. The same holds for the vertical faces of the integrator. This effect forces the spatial intensity distribution at pupil plane 21 after the integrator to be mirror-symmetric with respect to two perpendicular central axes MSA, the axes being parallel to respective boundary segments of the cross-section of the reflective integrator. In this text, several directions of boundary segments and axes are compared which are physically defined in different planes. When such a comparison is made, these directions are defined when viewed in a common plane perpendicular to the optical axis OPA. This means that if the optical axis is bent, for example by 90 degrees in between the pupil plane 20 and the integrator, or in between the integrator and the plane of the reticle, these different planes are first aligned parallel as if they are viewed upon in the direction of the optical axis followed by the comparison of directions.

Figure 2B:
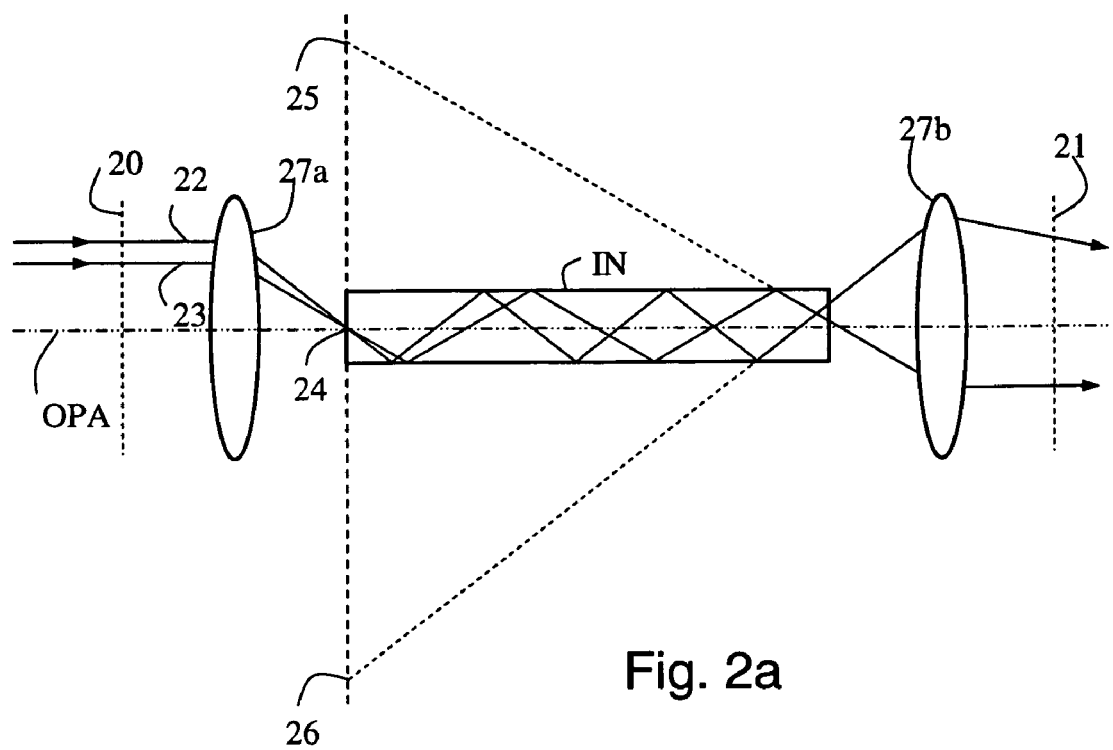
Figure 2B:
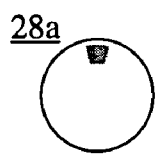
Figure 2E:
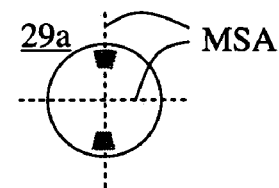
Figure 2C:
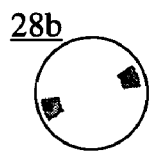
Figure 2F:
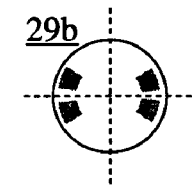
Figure 2D:
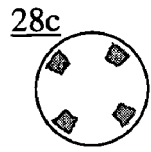
Figure 2G:
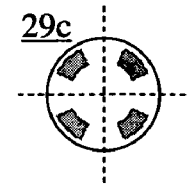

For example, a beam that enters the integrator with a monopole pupil shape 28a (as shown in FIG. 2b) gets a dipole pupil shape 29a (as shown in FIG. 2e) on exiting the integrator, being mirror-symmetric with respect to axes MSA. A rotated dipole 28b (as shown in FIG. 2c) ends up as a form of quadrupole 29b (as shown in FIG. 2f). Similarly a rotated quadrupole is converted into an octopole. A slightly rotated quadrupole 28c (as shown in FIG. 2d) is converted into a quadrupole with poles that are extended over a wider angle 29c (as shown in FIG. 2g), but with a noticeably higher intensity in a center part of the resulting poles corresponding to the mirror-symmetric part of the pupil shape in 28c. Similarly, a slightly rotated dipole is converted into a dipole with poles extended over a wider angle. In summary, any incoming pupil is converted into a corresponding pupil shape that is mirror-symmetric with respect to the two axes MSA parallel to the side faces (boundary segments of the cross-section) of the integrator.

Note that an integrator rod when made of quartz has a refractive index different from 1, so that FIG. 2a does not correctly show the rays of radiation at the entrance and exit faces of the rod where refraction occurs. For a hollow waveguide, this refraction is obviously absent. However, for the purpose of this invention, this refraction is not relevant. In addition, the figures are drawn schematically and not to scale.

Figure 3:
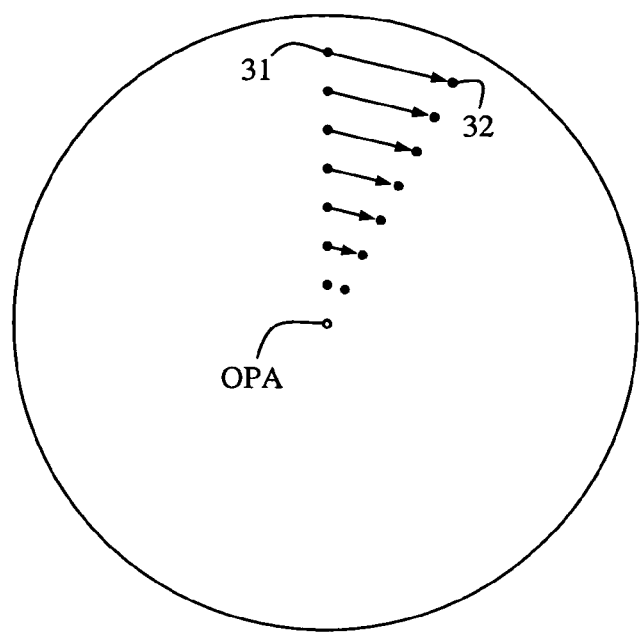
FIG. 3 schematically shows the rotation of an intensity distribution around the optical axis.

FIG. 3 schematically shows the rotation of an intensity distribution around the optical axis OPA, the latter being perpendicular to the plane of the drawing. The rotation is preferably carried out in a pupil plane 21 downstream of the reflective integrator IN (see FIG. 2). Rotation of the intensity distribution according to this invention means for example that all rays in the beam of radiation that would pass at point 31 in a pupil plane are substantially translated to point 32 in the pupil plane without a change of their directions. Rotation further implies that the further the distance of point 31 from the optical axis, the larger the translational distance from 31 to 32 in the pupil plane.

Figure 4:
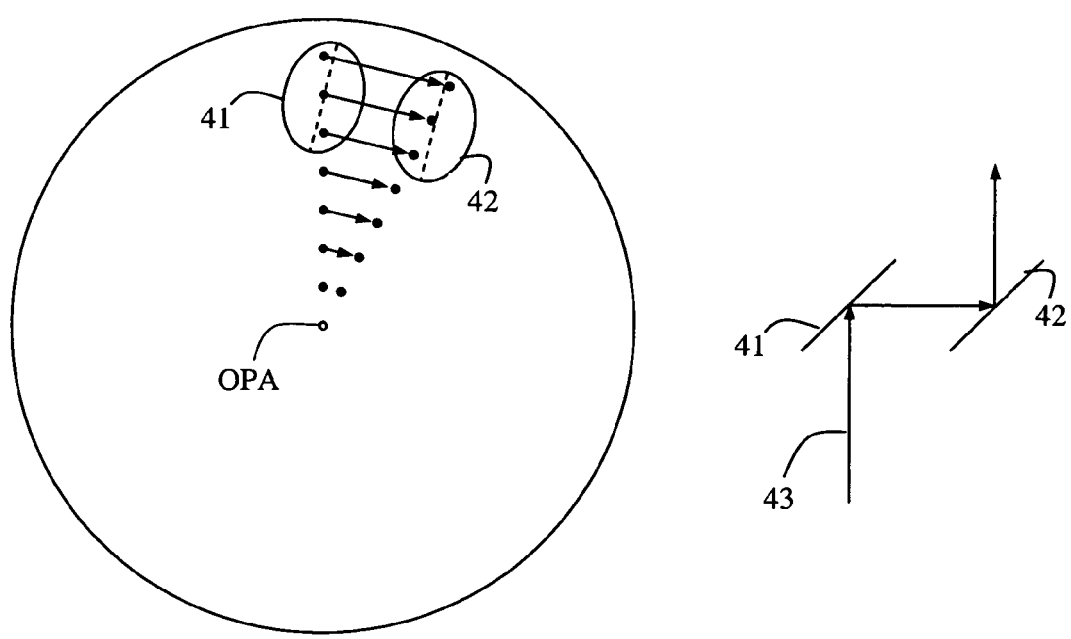
FIG. 4 shows a preferred embodiment of the current invention with a pair of two reflective surfaces, planar and parallel, to rotate part of the intensity distribution.

FIG. 4 shows an embodiment of the current invention. A pair of two planar reflective surfaces 41 and 42, such as for example two planar mirrors, are oriented in a parallel position with respect to each other such that a part of the intensity distribution in the pupil plane (e.g., a high intensity pole) is reallocated from mirror 41 to mirror 42 ideally without a change in angular intensity distribution. The change in angular intensity distribution that occurs is due to the increase in optical path corresponding to the distance between mirrors 41 and 42. For example, ray of radiation 43 is reflected from mirrors 41 and 42 and will experience a translation but without a change in direction. Ideally, the angular intensity distribution impinging at mirror 41 is identical to that originating from mirror 42. In practice, due to the distance between the mirrors and the resulting increase in size of the poles, the surface area of mirror 42 needs to be larger than the surface area of mirror 41, the latter at least having the size of the high intensity poles in the pupil plane. It is anticipated that this embodiment does not generate a pure rotation, as the translational distance for all points at the mirror is equal and thus independent of the distance from the optical axis OPA.

Figure 5:
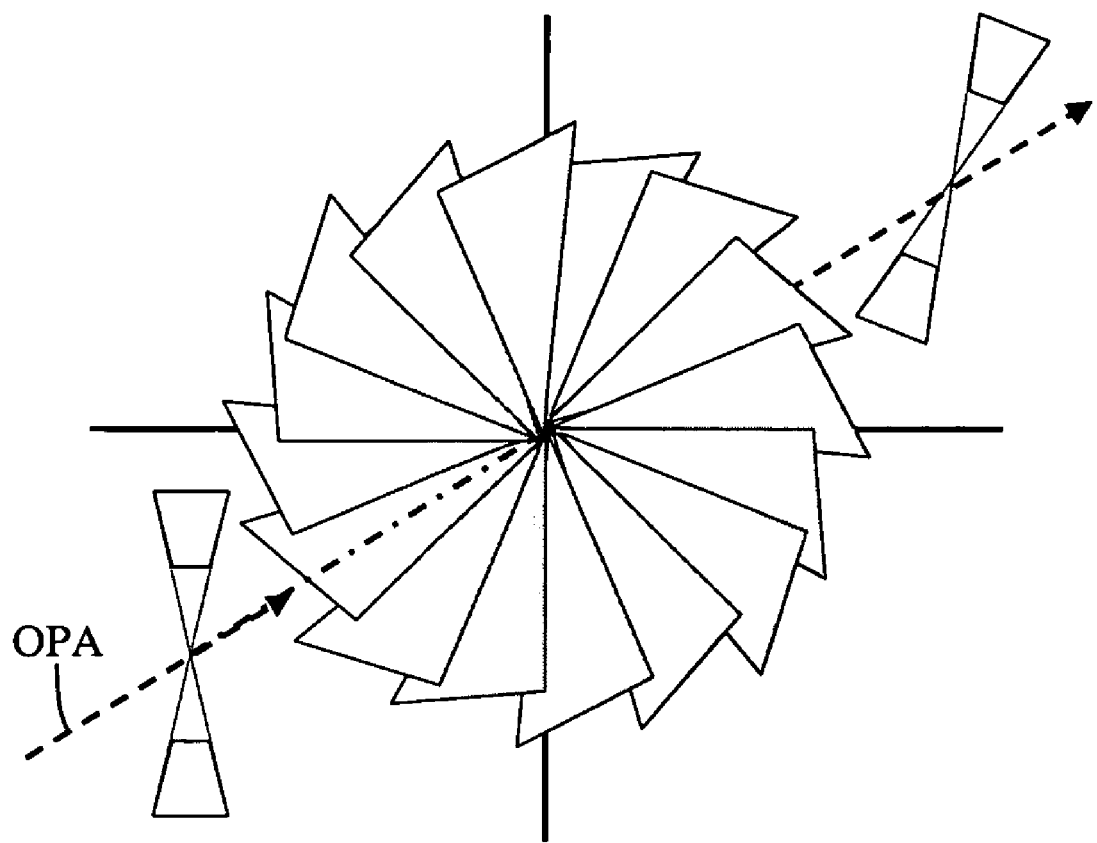
FIG. 5 shows another preferred embodiment with a plurality of mirror blades, configured like a turbine, to rotate any arbitrary intensity distribution.

FIG. 5 shows another embodiment of the optical element (50) including a plurality of tilted mirror blades, configured like a turbine, to rotate any arbitrary intensity distribution. The mirror blades in this embodiment have reflective surfaces at both sides so that a bottom side of one blade together with a top side of an adjacent blade forms a pair of reflective surfaces. Each pair of reflective surfaces rotates a part of the intensity distribution, and because of the closed turbine configuration substantially the whole intensity distribution in the pupil plane is being rotated. In this embodiment, the translational distance increases with distance from the optical axis so that a rotation in the meaning of this invention can be obtained.

What is claimed is:

1. A lithographic apparatus including an illumination system configured to condition a beam of radiation, the illumination system comprising:
   a reflective integrator disposed along an optical axis of the lithographic apparatus, the reflective integrator having a rectangular cross-section perpendicular to said optical axis, the cross-section having sides parallel to mutually perpendicular X and Y axes; and
   an optical element, constructed and arranged to redistribute an intensity distribution exiting the reflective integrator such that the intensity distribution is asymmetric with respect to at least one of the X and Y axes.

2. A lithographic apparatus according to claim 1, wherein said optical element is constructed and arranged to rotate an intensity distribution of a beam of radiation around said optical axis over an angle between 5 and 85 degrees.

3. A lithographic apparatus according to claim 2, wherein said angle is 90/n degrees where n is an integer number in a range from 2 to 18.

4. A lithographic apparatus according to claim 1, wherein said optical element is disposed downstream of said reflective integrator in a pupil plane of said illumination system.

5. A lithographic apparatus according to claim 4, wherein said optical element includes at least one pair of reflective surfaces, said pair of reflective surfaces constructed and arranged to reallocate part of the intensity distribution of said beam.

6. A lithographic apparatus according to claim 5, wherein a distance between the optical axis and said part of the intensity distribution upstream of said optical element is equal to said distance downstream of said optical element.

7. A lithographic apparatus according to claim 5, wherein said reflective surfaces include coated mirrors.

8. A lithographic apparatus according to claim 5, wherein said at least one pair of reflective surfaces are planar and parallel to each other so that a direction of a ray of said beam of radiation upstream of said optical element equals a direction of said ray downstream of said optical element.

9. A lithographic apparatus according to claim 5, wherein the optical element includes two pairs of reflective surfaces, each pair of reflective surfaces constructed and arranged to reallocate one of two respective poles of said intensity distribution.

10. A lithographic apparatus according to claim 5, wherein said optical element includes a plurality of pairs of reflective surfaces constructed and arranged to rotate substantially a whole intensity distribution of said beam of radiation.

11. A lithographic apparatus according to claim 10, wherein said plurality of pairs of reflective surfaces includes radially extending and tilted mirror blades, the mirror blades including a reflective coating at both sides.

12. A lithographic apparatus according to claim 11, wherein a thickness of said mirror blades varies as a function of distance from the optical axis and as a function of angle around the optical axis.

13. An illumination system including:
   a reflective integrator disposed along an optical axis, the reflective integrator having a rectangular cross-section perpendicular to said optical axis, the cross-section having sides parallel to mutually perpendicular X and Y axes; and
   an optical element, constructed and arranged to redistribute an intensity distribution exiting the reflective integrator such that the intensity distribution is asymmetric with respect to at least one of the X and Y axes.

14. An illumination system according to claim 13, wherein said optical element is constructed and arranged to rotate an intensity distribution of a beam of radiation around said optical axis over an angle between 5 and 85 degrees.

15. An illumination system according to claim 13, wherein said optical element is disposed downstream of said reflective integrator in a pupil plane of said illumination system and said optical element includes at least one pair of reflective surfaces, said pair of reflective surfaces constructed and arranged to reallocate part of the intensity distribution of said beam.

16. An illumination system according to claim 15, wherein the optical element includes two pairs of reflective surfaces, each pair of reflective surfaces constructed and arranged to reallocate one of two respective poles of said intensity distribution.

17. An illumination system according to claim 15, wherein said optical element includes a plurality of pairs of reflective surfaces constructed and arranged to rotate substantially a whole intensity distribution of said beam of radiation.

18. A lithographic apparatus comprising:
   an illumination system configured to condition a beam of radiation;
   a support structure configured to support a patterning device, the patterning device configured to impart the beam with a pattern;
   a substrate table configured to hold a substrate; and
   a projection system configured to project the patterned beam onto a target portion of the substrate,
   wherein the illumination system comprises:
   a reflective integrator disposed along an optical axis of the lithographic apparatus, the reflective integrator having a rectangular cross-section perpendicular to said optical axis, the cross-section having sides parallel to mutually perpendicular X and Y axes, and
   an optical element, constructed and arranged to redistribute an intensity distribution exiting the reflective integrator such that the intensity distribution is asymmetric with respect to at least one of the X and Y axes.

* * * * *